United States Patent [19]
Lowe et al.

[11] Patent Number: 5,101,419
[45] Date of Patent: Mar. 31, 1992

[54] FIXED DUTY CYCLE CLOCK GENERATOR

[75] Inventors: William M. Lowe; Leland F. Rusk, both of Austin, Tex.

[73] Assignee: Advanced Micro Devices, Inc., Sunnyvale, Calif.

[21] Appl. No.: 510,740

[22] Filed: Apr. 18, 1990

[51] Int. Cl.$^5$ ............................................. H04L 7/00
[52] U.S. Cl. ................................ 375/106; 328/136; 377/107
[58] Field of Search ................ 375/106, 111; 307/470, 307/525, 526, 527, 528, 272.3; 328/63, 136, 139; 377/47, 50, 107, 118, 119, 120

[56] References Cited

U.S. PATENT DOCUMENTS

| | | | |
|---|---|---|---|
| 3,663,885 | 5/1972 | Stewart | 328/136 |
| 4,214,270 | 7/1980 | Morito | 328/139 |
| 4,622,481 | 11/1986 | Nortrup | 377/109 |

*Primary Examiner*—Benedict V. Safourek
*Attorney, Agent, or Firm*—Foley & Lardner

[57] ABSTRACT

There is disclosed an improved clock generator responsive to a first clock signal having a frequency $f_1$ and a second clock signal having a frequency $f_2$, wherein $f_2$ is equal to $nf_1$. The clock generator provides a fixed duty cycle clock signal having a period equal to n complete cycles of the second clock signal and being at a first level for m complete cycles of the second clock signal and a second level for n-m complete cycles of the second clock signal. The clock generator includes a counter for counting half-cycles of the second clock signal to derive the first and second levels, and a flip-flop for establishing a timing condition responsive to the first clock signal. The clock generator further includes an inhibit circuit coupled to the counter for enabling the counter to begin a new counting period in response to the counter counting n complete cycles of the second clock signal and the establishment of the timing condition. The clock generator inhibit circuit guarantees a consistent duty cycle signal output immune to variations of the period of the first clock signal to as low as $n-\frac{1}{2}$ complete cycles of the second clock signal.

23 Claims, 2 Drawing Sheets

FIXED DUTY CYCLE CLOCK GENERATOR

BACKGROUND OF THE INVENTION

The present invention generally relates to an improved synchronizing circuit and particularly to a synchronizing circuit of the type which provides a synchronizing signal having a first level during a fractional portion of each synchronizing signal period and a second level during the remaining fractional portion of each synchronizing period. The present invention is more particularly directed to such a synchronizing circuit which includes means for maintaining the synchronizing signal periods and the respective fractional portions thereof constant.

There are many applications in modern electronic technology wherein a synchronizing signal is required. One such application is in the field of data transmission wherein a timing pulse is required followed by a period for data transmission. For example, such a synchronizing signal may be at a high level for one-fourth of the synchronizing signal period for synchronization and at a low level for three-fourths of the synchronizing signal periods during which time date is transmitted.

Such a synchronizing signal is generally generated by a synchronizing circuit which responds to a first clock signal having a relatively low frequency ($f_1$) and a second clock signal having a relatively high frequency ($f_2$) equal to, for example, four times the first clock signal frequency. Such circuits utilize the first clock signal to control the duration of a timing period and the second clock signal to derive, through counting means, the high and low outputs for the proper time durations. In the above example, the second clock signal would be used to derive a high output for two half-cycles of the second clock signal and a low output for six half-cycles of the second clock signal. Other duty cycles are also obtainable depending upon the number of counting means stages and the number of multiples of the second clock signal frequency as compared to the first clock signal frequency.

While such synchronizing circuits have been generally successful in the past, there is a problem which can arise during their operation under certain conditions when the relative frequencies of the first and second clock signals are not exact multiples of each other and when there is a phase difference between the first and second clock signals. In some cases, under such conditions, the relative frequencies and phase relationships of the first and second clock signals can result in the synchronizing circuit not providing the properly timed synchronizing signal. More specifically, under such conditions, the synchronizing circuits may provide a synchronizing signal wherein the synchronizing signal period is not constant and therefore, the ratio of the high and low level periods can correspondingly change. This results because the counting means does not always count the same number of second clock signal half-cycles for each counting period. During some counting periods, the counting means may count for all eight half-cycles of the second clock signal and during other counting periods, the counting means may count for only six half-cycles of the second clock signal. The result is a synchronizing signal which may have a high to low level ratio of 1:2 for some counting periods and a high to low ration of 1:3 for other counting periods.

The present invention overcomes these problems by providing, in addition to the counting means, an inhibit means to preclude the timing means from beginning a new counting period until after it has counted the required number of half-cycles of the second clock signal. This assures that the synchronizing signal periods and the ratio of the high to low level portions of the synchronizing signal periods remain constant.

The inhibit means of the circuit allows a given cycle of the first clock signal to vary to as low as n-½ complete cycles of the second clock signal while continuing to guarantee the synchronized signal output response described above provided that the variation is compensated for in the subsequent cycles of the first clock signal.

SUMMARY OF THE INVENTION

The present invention provides an improved synchronizing circuit responsive to a first clock signal having a frequency $f_1$ and a second clock signal having a frequency $f_2$ wherein $f_2$ is equal to $nf_1$, for generating a synchronizing signal having a period equal to n complete cycles of the second clock signal and being a first level for m complete cycles of the second clock signal and a second level for n-m complete cycles of the second clock signal. The synchronizing circuit includes an output and counting means responsive to the first and second clock signals for repeatedly counting half-cycles of the second clock signal during repeated counting periods for providing at the output the first level during the m complete cycles of the second clock signal and the second level during the n-m complete cycles of the second clock signal. The synchronizing circuit further includes inhibit means coupled to the counting means for precluding the counting means from beginning a new counting period until the counting means has counted n complete cycles of the second clock signal.

The present invention more particularly provides an improved synchronizing circuit responsive to a first clock signal having a frequency $f_1$ and a second clock signal having a frequency $f_2$, wherein $f_2$, is substantially equal to $4f_1$ for generating a synchronizing signal having a period equal to four complete cycles of the second clock signal, a first level for one complete cycle of the second clock signal, and a second level for three complete cycles of the second clock signal. The synchronizing circuit includes an output and counting means responsive to the first and second clock signals for repeatedly counting, during repeated counting periods, eight half-cycles of the second clock signal for providing at the output the first level during two half-cycles of the second clock signal and the second level during six half-cycles of the second clock signal. The synchronizing circuit further includes inhibit means coupled to the counting means for precluding the counting means from beginning a new counting period until the counting means has counted eight complete half-cycles of the second clock signal.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawings in the several figures of which like reference numerals identify identical elements and wherein:

DESCRIPTION OF THE PREFERRED EMBODIMENT

Figure 1:
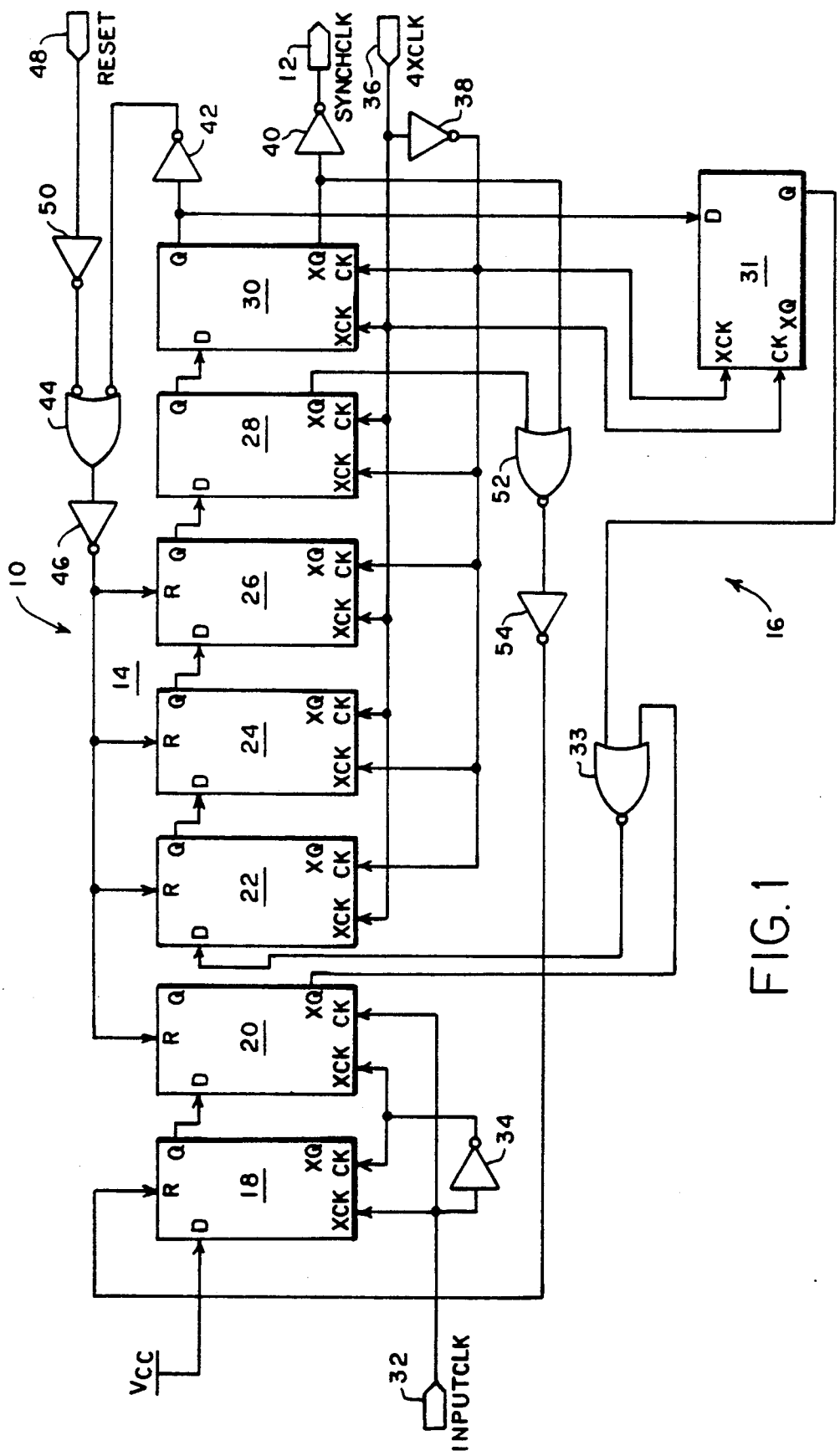
FIG. 1 is a schematic circuit diagram of a synchronizing circuit embodying the present invention.

Referring now to FIG. 1, it illustrates a synchronizing circuit 10 embodying the present invention. The synchronizing circuit 10 generally includes an output 12, a counting means 14, and an inhibit means 16.

The counting means 14 comprises a plurality of latches 18, 20, 22, 24, 26, 28 and 30. As can be seen in the Figure, each of these latches includes a D input, a Q output, an XQ output, a CK clock input, and an XCK clock input. These D-type latches are well known in the art and operate so that when the CK clock input transitions high and the XCK clock input transitions low, the logic level at the D input is transferred to the Q output and the compliment of the logic level at the D input is transferred to the XQ output. When the CK clock input transitions low and the XCK clock input transitions high, the Q and XQ outputs are latched. In addition, as can further be noted in the Figure, latches 18, 20, 22, 24 and 26 include a reset input. When these latches receive a low level at their reset inputs, their Q outputs ar reset to a low level and their XQ outputs are set to a high level.

Latches 18 and 20 of the counting means 14 are coupled to an input terminal 32 which is adapted to receive a first clock signal identified herein as INPUTCLK. More specifically, the XCK clock input of latch 18 and the CK clock input of latch 20 are coupled directly to the terminal 32. The CK clock input of latch 18 and the XCK clock input of latch 20 are coupled to the terminal 32 through an inverter 34. The Q output of latch 18 is coupled to the D input of latch 20 and the D input of latch 18 is coupled to a logical one voltage source $V_{cc}$. As will be seen hereinafter, the latches 18 and 20 form a flip-flop which provides a timing condition for the remaining latches of the counting means.

Latches 22, 24, 26, 28 and 30 comprise five serially coupled latches which perform the counting function of the counting means 14. Each of these latches is coupled to another input terminal 36 which is adapted to receive a second clock signal identified herein as 4XCLK. In accordance with this preferred embodiment, the first clock signal received at terminal 32 has a frequency of $f_1$ and the second clock signal received at terminal 36 has a frequency of $f_2$ which is substantially equal to $4f_1$. As can be noted in the Figure, the XCK clock inputs of latches 22, 26 and 30 and the CK clock inputs of latches 24 and 28 are coupled directly to the terminal 36 for receiving the second clock signal and the XCK clock inputs of latches 24 and 28 and the CK clock inputs of latches 22, 26 and 30 are coupled to the terminal 36 through an inverter 38 for receiving the compliment of the second clock signal. The Q output of latch 22 is coupled to the D input of latch 24, the Q output of latch 24 is coupled to the D input of latch 26, the Q output of latch 26 is coupled to the D input of latch 28 and the Q output of latch 28 is coupled to the D input of latch 30. The XQ output of latch 30 is coupled to the output 12 through an inverter 40 for providing at the output 12 the synchronizing signal.

The Q output of latch 30 is coupled to the reset inputs of latches 20, 22, 24 and 26 through an inverter 42, a NAND gate 44, and another inverter 46. NAND gate 44 has a second input which is coupled to a reset input terminal 48 through an inverter 50.

The XQ output of latch 28 is coupled to one input of a NOR gate 52. The XQ output of latch 30 is coupled to the other input of NOR gate 52. The output of NOR gate 52 is coupled to the reset input of latch 18 through an inverter 54. As will be seen hereinafter, latches 18, 20, 22, 24 and 26 are all reset after the counting means 14 has counted five complete half-cycles of the second clock signal.

The inhibit means 16 comprises a further latch 31 and a NOR gate 33. The D input of latch 31 is coupled to the Q output of latch 30. The CK clock input of latch 31 is coupled directly to the terminal 36 for receiving the second clock signal. The XCK clock input of latch 31 is coupled to the output of inverter 38 for receiving the compliment of the second clock signal. The Q output of latch 31 is coupled to one input of the NOR gate 33. The other input of NOR gate 33 is coupled to the XQ output of latch 20. Finally, the output of NOR gate 33 is coupled to the D input of latch 22 which comprises the input to the counting means 14.

As will be seen hereinafter, the synchronizing circuit 10 provides a synchronizing signal at output 12 which has a period equal to four complete periods of the second clock signal. During the period of the second clock signal, the synchronizing signal is at a high level for one complete period of the second clock signal and at a low level for three complete periods of the second clock signal. The counting means 14 is responsive to the second clock signal for counting half-cycles of the second clock signal. As a result, the synchronizing signal will be at a high level for two complete half-cycles of the second clock signal and at a low level for six complete half-cycles of the second clock signal. The inhibit means 16 is coupled between the output of the synchronizing circuit and the input to the counting means to preclude the counting means from counting a new counting period of eight complete half-cycles of the second clock signal until the counting means has counted eight complete half-cycles of the second clock signal during the previous counting period.

Figure 2:
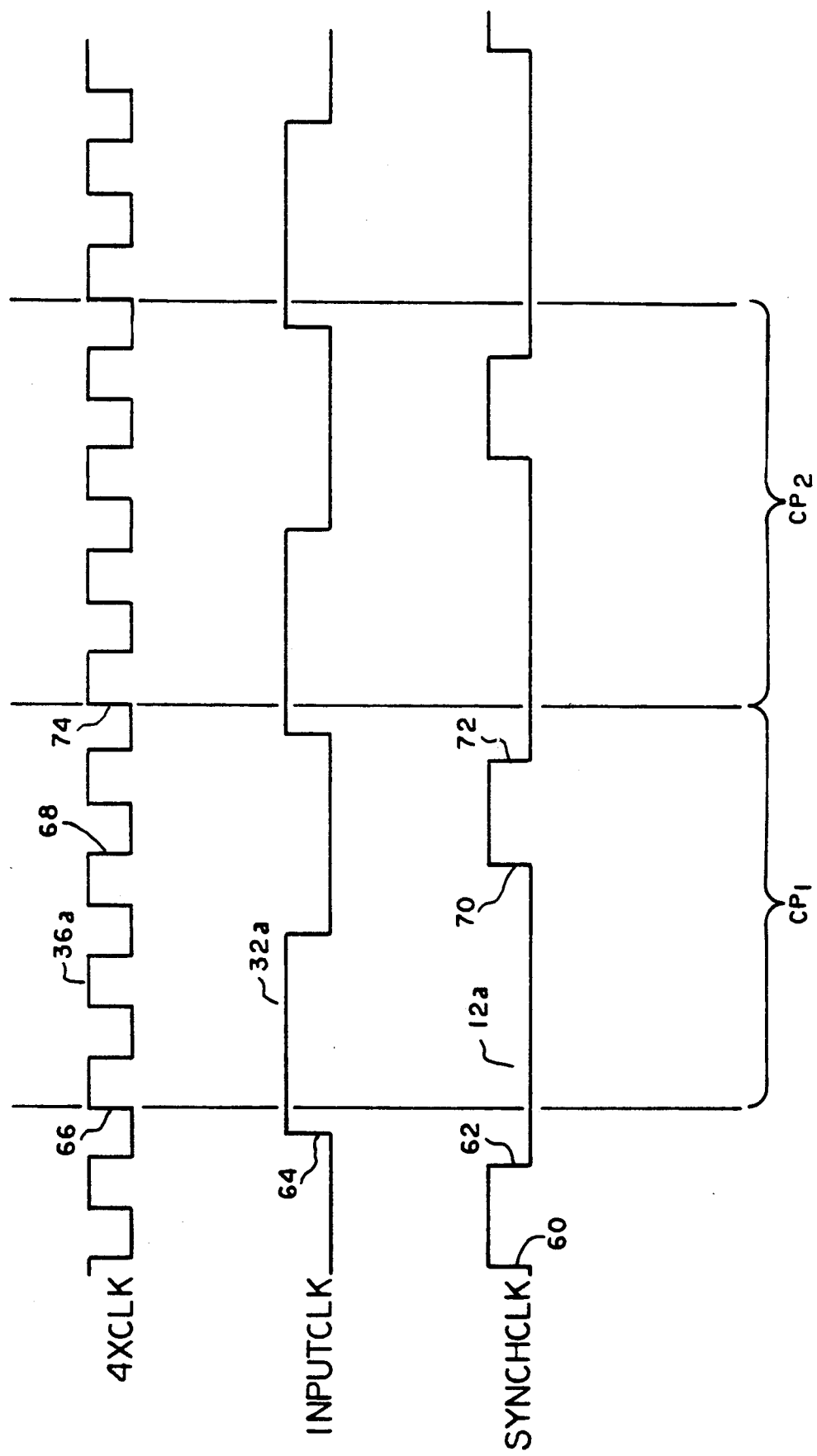
FIG. 2 illustrates a plurality of waveforms which may be utilized to better understand the operation of the synchronizing circuit of FIG. 1.

Referring now to FIG. 2, it illustrates the first clock signal 32a which is impressed upon the input terminal 32 of the synchronizing circuit 10, the second clock signal 36a which is impressed upon the input terminal 36 of the synchronizing circuit 10, and the output synchronizing signal 12a which is provided at output terminal 12 of the synchronizing circuit 10. The signals 12a, 32a and 36a are shown for two complete counting periods $CP_1$ and $CP_2$ of the counting means 14 and a portion of the counting period preceding counting period $CP_1$ and a portion of the counting period succeeding counting period $CP_2$. As will be noted, the second clock signal 36a has a frequency which is substantially four times the frequency of the first clock signal 32a. The first and second clock signals have been intentionally illustrated as being out of phase to illustrate the particular advantages of the present invention.

During the counting period preceding counting period $CP_1$, latches 20, 22, 24 and 26 were reset upon the rising edge 60 of the synchronizing signal 12a. This caused the Q output of latch 20 to go to a low level and the XQ output of latch 20 to go to a high level. Also upon the rising edge 60 of the synchronizing signal, latch 18 was reset but the reset level was removed upon the falling edge 62 of the synchronizing signal 12a. By virtue of the D input of latch 18 being coupled to $V_{cc}$, this resulted in the Q output of latch 18 and the D input of latch 20 to be at a high level. Upon the rising edge 64 of the first clock signal, the high level at the D input of latch 20 was transferred to the Q output of latch 20 causing the XQ output of latch 20 to in turn go to a low level. Hence, the input of NOR gate 33 coupled to the XQ output of latch 20 was forced to a low level upon the rising edge 64 of the first clock signal. Also, at this time, the synchronizing signal output is at a low level along with the Q output of latch 30. The low level at the Q output of latch 30 caused a low level to be impressed upon the D input of latch 31. The next transition of the second clock signal, and more particularly the rising edge 66 of the second clock signal causes the low level at the D input of latch 31 to be transferred to the Q output of latch 31. This causes the other input of NOR gate 33 to be at a low level to provide a high level at the D input of latch 22. This marks the beginning of the new counting period $CP_1$.

The counting means 14 begins to count the half-cycles of the second clock signal. With each transition of the second clock signal, the high level at the D input of latch 22 is propagated through each of the latches. After the fifth complete half-cycle of the second clock signal represented by the falling edge 68 of the second clock signal, a high level will appear at the Q output of latch 30 and a low level at the XQ output of latch 30. This causes the output of the synchronizing circuit at output 12 to transition from a low level to a high level as shown by the rising edge 70 of the synchronizing signal.

When the Q output of latch 30 goes to a high level, latches 20, 22, 24 and 26 are reset to force their Q outputs to a low level. Also, when the synchronizing signal goes to a high level, the XQ output of latch 30 goes to a low level. This low level, together with the low level at the XQ output of latch 28 causes the latch 18 to be reset through NOR gate 52 and inverter 54.

The low level now appearing at the D input of latch 28 is propagated to Q output of latch 30 during the next two half-cycles of the second clock signal. After these two half-cycles, the Q output of latch 30 goes to a low level and the XQ output of latch 30 goes to a high level. This causes the synchronizing signal at output 12 to go to a low level.

Thus far, the counting means has counted seven and one-half complete half-cycles of the second clock signal. When the synchronizing signal goes to a low level after the seventh complete half-cycle of the second clock signal as illustrated by the falling edge 72 of the synchronizing signal, the Q output of latch 30 also goes to a low level. This impresses a low level upon the D input of latch 31. The low level at the D input of latch 31 is not propagated to the Q output of latch 31 until the next rising edge 74 of the second clock signal. When the rising edge 74 appears, the low level at the D input of latch 31 is transferred to its Q output to once again cause NOR gate 33 to provide a high level to the D input of latch 22 to begin a new counting period $CP_2$.

The foregoing is repeated during each counting period. As can be seen, during the first five half-cycles of the second clock signal, the synchronizing signal at output 12 is at a low level, during the sixth and seventh half-cycles of the second clock signal the synchronizing signal at output 12 is at a high level, and during the last and final eighth half-cycle of the second clock signal, the synchronizing signal is at a low level. During the last half-cycle, the inhibit means comprising latch 31 and NOR gate 33 preclude the counting means 14 from beginning a new counting period until the counting means has counted eight complete half-cycles of the second clock signal. Hence, regardless of the phase relationship between the first and second clock signal, the inhibit means 16 will always force the counting means to count four complete periods of the second clock signal before beginning a new counting period. This assures that the synchronizing circuit will always provide a synchronizing signal having a constant period of four complete periods of the second clock signal.

As will be appreciated by those skilled in the art, by adding additional latches to the plurality of counting latches the ratio between the high level portion and the low level portion of the synchronizing signal may be varied. For example, to obtain a synchronizing signal which provides a high level for one-fifth of the period and a low level for four-fifths of the period, an additional pair of latches may be inserted between latches 24 and 26.

Hence, the present invention provides a new and improved synchronizing circuit which is responsive to a first clock signal having a frequency $f_1$ and a second clock signal having a frequency $f_2$, wherein $f_2$ is equal to $nf_1$ for generating a synchronizing signal having a period equal to n complete cycles of the second clock signal and being at a first level for m complete cycles of the second clock signal and a second level for n-m complete cycles of the second clock signal. In the preferred embodiment described above, n is equal to 4 and m is equal to 1. Also, in the preferred embodiment, the first level is a logical one or a high level and the second level is a logical zero or a low level.

While a particular embodiment of the present invention has been shown and described, modifications may be made, and it is therefore intended to cover in the appended claims all such changes and modifications which fall within the true spirit and scope of the invention.

What is claimed is:

1. A clock generator responsive to a first clock signal having a frequency $f_1$ and a second clock signal having a frequency $F_2$, wherein $f_2$ is substantially equal to $nf_1$, for generating a fixed duty cycle clock signal having a period equal to n complete cycles of said second clock signal and being at a first level for m complete cycles of said second clock signal and a second level for n-m complete cycles of said second clock signal, said clock generator comprising:

an output;

counting means responsive to said second clock signal for repeatedly counting half-cycles of said second clock signal during repeated counting periods for providing at said output said first level during said m complete cycles of said second clock signal and said second level during said n-m complete cycles of said second clock signal said counting means including means for establishing a timing condition responsive to said first clock signal; and inhibit means coupled to said counting means for precluding said counting means from beginning a new counting period until said counting means has counted n complete cycles of said second clock signal and for enabling said counting means to begin said new counting period responsive to said counting means counting said n complete cycles of said second clock signal and the establishment of said timing condition.

2. A clock generator as defined in claim 1 wherein said counting means includes an input and wherein said inhibit means are coupled between said output and said counting means input.

3. A clock generator as defined in claim 2 wherein said inhibit means are responsive to said second clock signal for enabling said counting means after the last half-cycle of each said counting period.

4. A clock generator as defined in claim 3 wherein said inhibit means includes latch means having a clock input coupled to said second clock signal.

5. A clock generator responsive to a first clock signal having a frequency $f_1$ and a second clock signal having a frequency $f_2$, wherein $f_2$ is substantially equal to $nf_1$, for generating a fixed duty cycle clock signal having a period equal to n complete cycles of said second clock signal and being at a first level for m complete cycles of said second clock signal and a second level for n-m complete cycles of said second clock signal, said clock generator comprising:
an output;
counting means responsive to said second clock signal for repeatedly counting half-cycles of said second clock signal during repeated counting periods for providing at said output said first level during said m complete cycles of said second clock signal and said second level during said n-m complete cycles of said second clock signal said counting means including means for establishing a timing condition responsive to said first clock signal;
inhibit means coupled to said counting means for precluding said counting means from beginning a new counting period until said counting means has counted n complete cycles of said second clock signal and for enabling said counting means to begin said new counting period responsive to said counting means counting said n complete cycles of said second clock signal and the establishment of said timing condition;
said counting means including an input and said inhibit means being coupled between said output and said counting means input;
said inhibit means being responsive to said second clock signal for enabling said counting means after the last half-cycle of each said counting period;
said inhibit means including latch means having a clock input coupled to said second clock signal; and
said latch means clock input comprising a first clock input coupled to said second clock signal and a second clock input coupled to the complement of said second clock signal.

6. A clock generator as defined in claim 5 wherein said inhibit means further includes gate means coupled between said latch means output and said counting means input.

7. A clock generator as defined in claim 6 wherein said gate means includes a first input coupled to said latch means output, a second input responsive to said timing condition, and an output coupled to said counting means input.

8. A clock generator as defined in claim 7 wherein said means for establishing a timing condition includes a flip-flop and wherein said gate means second input is coupled to said flip-flop.

9. A clock generator as defined in claim 8 wherein said flip-flop comprises a pair of latches.

10. A clock generator as defined in claim 7 wherein said gate means comprises a NOR gate.

11. A clock generator as defined in claim 1 wherein n is equal to four and wherein m is equal to one.

12. A clock generator as defined in claim 1 wherein said first level is a logical one and said second level is a logical zero.

13. A clock generator responsive to a first clock signal having a frequency $f_1$ and a second clock signal having a frequency $f_2$, wherein $f_2$ is substantially equal to $4f_1$, for generating a fixed duty cycle clock signal having a period equal to four complete cycles of said second clock signal, a first level for one complete cycle of said second clock signal, and a second level for three complete cycles of said second clock signal, said clock generator comprising:
an output;
counting means responsive to said second clock signal for repeatedly counting, during repeated counting periods, eight half-cycles of said second clock signal for providing at said output said first level during two half-cycles of said second clock signal and said second level during six half-cycles of said second clock signal said counting means including means for establishing a timing condition responsive to said first clock signal; and
inhibit means coupled to said counting means for precluding said counting means from beginning a new counting period until said counting means has counted eight complete half-cycles of said second clock signal and for enabling said counting means to begin said new counting period responsive to said counting means counting said eight complete half-cycles of said second clock signal and the establishment of said timing condition.

14. A clock generator as defined in claim 13 wherein said inhibit means are responsive to said second clock signal for precluding said counting means from beginning a new counting period until said counting means has counted a complete eighth half-cycle of said second clock signal.

15. A clock generator as defined in claim 14 wherein said counting means are arranged to provide said second level during the first five half-cycles of said second clock signal, said first level during the sixth and seventh half-cycles of said second clock signal, and said second level during the eighth half-cycle of said second clock signal.

16. A clock generator as defined in claim 15 wherein said inhibit means are responsive to said second level during said eighth half-cycle of said second clock signal for precluding said counting means from beginning a new counting period.

17. A clock generator responsive to a first clock signal having a frequency $f_1$ and a second clock signal having a frequency $f_2$, wherein $f_2$ is substantially equal to $4f_1$, for generating a fixed duty cycle clock signal having a period equal to four complete cycles of said second clock signal, a first level for one complete cycle of said second clock signal, and a second level for three complete cycles of said second clock signal, said clock generator comprising:
an output;
counting means responsive to said second clock signal for repeatedly counting, during repeated counting periods, eight half-cycles of said second clock signal for providing at said output said first level during two half-cycles of said second clock signal and said second level during six half-cycles of said second clock signal said counting means including means for establishing a timing condition responsive to said first clock signal;

inhibit means coupled to said counting means for precluding said counting means from beginning a new counting period until said counting means has counted eight complete half-cycles of said second clock signal and for enabling said counting means to begin said new counting period responsive to said counting means counting said eight complete half-cycles of said second clock signal and the establishment of said timing condition;

said inhibit means being responsive to said second clock signal for precluding said counting means from beginning a new counting period until said counting means has counted a complete eighth half-cycle of said second clock signal;

said counting means being arranged to provide said second level during the first five half-cycles of said second clock signal, said first level during the sixth and seventh half-cycles of said second clock signal, and said second level during the eighth half-cycle of said second clock signal;

said inhibit means being responsive to said second level during said eighth half-cycle of said second clock signal for precluding said counting means from beginning a new counting period; and said counting means comprising a plurality of serially coupled latches, a first one of said latches including the input of said counting means, and at least one of said latches including said circuit output, and said inhibit means comprising a further latch having an input coupled to said output and an output coupled to said counting means input.

18. A clock generator as defined in claim 17 wherein said inhibit means further include gate means coupled said further latch output to said counting means input.

19. A clock generator as defined in claim 18 wherein said gate means has a first input coupled to said further latch output and a second input coupled to said means for establishing a timing condition.

20. A clock generator as defined in claim 19 wherein said means for establishing a timing condition includes a flip-flop, and wherein said gate means second input is coupled to said flip-flop.

21. A clock generator as defined in claim 20 wherein said plurality of latches comprises five latches.

22. A clock generator as defined in claim 21 wherein said gate means comprises a NOR gate.

23. A clock generator as defined in claim 13 wherein said first level is a logical one and said second level is a logical zero.

* * * * *